United States Patent
Barbara et al.

(10) Patent No.: US 8,472,276 B1
(45) Date of Patent: Jun. 25, 2013

(54) SYSTEM AND METHOD FOR DE-LATCH OF AN INTEGRATED CIRCUIT

(75) Inventors: Bruce Barbara, Discovery Bay, CA (US); Morgan Whately, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 283 days.

(21) Appl. No.: 13/037,157

(22) Filed: Feb. 28, 2011

Related U.S. Application Data

(60) Provisional application No. 61/323,846, filed on Apr. 13, 2010.

(51) Int. Cl.
*G11C 5/14* (2006.01)

(52) U.S. Cl.
USPC ........................... 365/226; 365/189.05

(58) Field of Classification Search
USPC ............................................ 365/226, 189.05
See application file for complete search history.

(56) References Cited

U.S. PATENT DOCUMENTS

| | | | | |
|---|---|---|---|---|
| 5,966,324 A | * | 10/1999 | Wada et al. | 365/177 |
| 6,294,404 B1 | * | 9/2001 | Sato | 438/106 |

* cited by examiner

*Primary Examiner* — Son Dinh
*Assistant Examiner* — Nam Nguyen

(57) ABSTRACT

A system and method is provided for hot de-latch of a parasitic device in an integrated circuit (IC) that restores the IC to normal operation without de-powering the IC or resulting in a loss of data. In one embodiment the method, includes reducing a voltage supplied to at least a portion of the IC from a normal operation voltage to a de-latch voltage for a time to de-latch the parasitic device without de-powering the IC. Other embodiments are also disclosed.

24 Claims, 8 Drawing Sheets

SYSTEM AND METHOD FOR DE-LATCH OF AN INTEGRATED CIRCUIT

CROSS-REFERENCE TO RELATED APPLICATIONS

The present application claims the benefit of priority under 35 U.S.C. 119(e) to U.S. Provisional Patent Application Ser. No. 61/323,846 entitled "System And Method For De-Latch Of A Silicon Controlled Rectifier," filed Apr. 13, 2010, which application is hereby incorporated by reference in its entirety.

TECHNICAL FIELD

The present disclosure relates generally to semiconductor circuits and more particularly to latch-up of an integrated circuit.

BACKGROUND

A problem with CMOS and bipolar integrated circuits (ICs) is single-event latch-up (SEL). Advanced-technology CMOS and bipolar integrated circuits intrinsically include parasitic bipolar p-n-p and n-p-n transistors that form a circuit equating to a silicon controlled rectifier (SCR) p-n-p-n. SEL occurs when a spurious current spike, introduced by cosmic neutron or other charged particle, activates the SCR creating a low impedance path and causing a large amount of current flow between the IC's power supply pins Vcc and Vss, thereby disabling the integrated circuit. A SEL is a potentially destructive condition which may or may not cause permanent damage to the circuit, but causes loss of circuit functionality.

BRIEF DESCRIPTION OF THE DRAWINGS

These and various other features of a de-latch system and methods of operating the same will be apparent upon reading of the following detailed description in conjunction with the accompanying drawings and the appended claims provided below, where:

DETAILED DESCRIPTION

Figure 1:
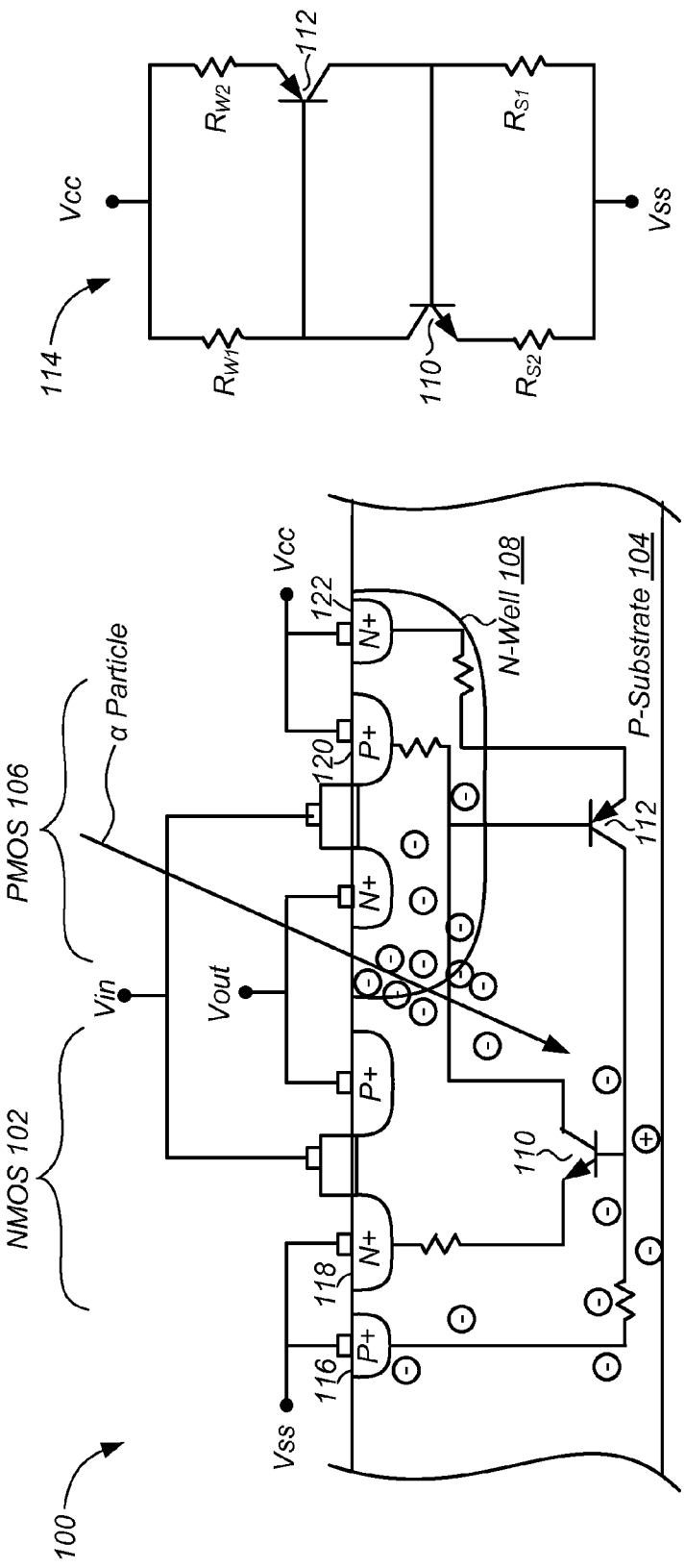
FIG. 1A is a cross section of a portion of an integrated circuit (IC) including parasitic device and illustrating a single-event latch-up (SEL)
FIG. 1B is a schematic diagram of the parasitic device of FIG. 1A.

A system and method is provided for hot de-latch of a parasitic device, such as a parasitic silicon controlled rectifier (SCR), in an integrated circuit (IC) that restores the IC to normal operation without de-powering the IC or resulting in a loss of data. In one embodiment the method, comprises d reducing a voltage supplied to at least a portion of the IC from a normal operation voltage to a de-latch voltage for a time to de-latch the parasitic device without de-powering the IC. Other embodiments are also disclosed.

The drawings described are only schematic and are non-limiting. In the drawings, the size of some of the elements may be exaggerated and not drawn to scale for illustrative purposes. The dimensions and the relative dimensions may not correspond to actual reductions to practice of the invention. For purposes of clarity, many of the details of integrated circuit fabrication and operation in general and semiconductor memories in particular, which are widely known and not relevant to the present system and method have been omitted from the following description.

Complementary metal-oxide-semiconductor (CMOS) and bipolar integrated circuits (ICs) are susceptible to single-event latch-up (SEL) effects caused by charged particles, such as ions or protons from cosmic rays or other sources of radiation.

FIG. 1A is a simplified cross-sectional view of a portion of a CMOS integrated circuit (IC) 100 including a n-channel MOS field effect transistor (NMOS 102) formed in a p-type silicon substrate 104, and a p-channel MOS field effect transistor (PMOS 106) formed in a n-well 108 in the substrate. The IC 100 further includes a pair of parasitic bipolar n-p-n 110 and p-n-p 112 transistors intrinsically formed between the substrate 104, n-well 108 and diffusion regions of the NMOS 102 and PMOS 106 devices, connected or configured form a parasitic device, such as a parasitic silicon controlled rectifier (SCR) 114, shown schematically in FIG. 1B. In particular, the base of parasitic n-p-n 110 is coupled to Vss supplied to P+ diffusion region 116 to the through an inherent substrate resistance ($R_{S1}$), the emitter is coupled to Vss supplied to N+ diffusion region 118 through inherent substrate resistance ($R_{S2}$), and the collector is coupled to Vcc supplied to P+ diffusion region 120 through inherent well resistance ($R_{W1}$). The base of parasitic p-n-p 112 is coupled to Vcc supplied to P+ diffusion region 120 through $R_{W1}$, the collector is coupled to Vss supplied to P+ diffusion region 116 through $R_{S1}$, and the emitter is coupled to Vcc supplied to N+ diffusion region 122 through inherent well resistance ($R_{W2}$).

Under normal operating conditions these connections bias the parasitic SCR 114 off. However, in a SEL a spurious current spike, introduced by charged particle (a), such as an ion or proton from cosmic rays, can forward bias a base to emitter diode of the n-p-n transistor 110 or p-n-p transistor 112, causing the forward biased transistor to conduct through a collector to emitter, thereby activating the parasitic SCR 114 and causing the other transistor to begin conducting re-enforcing the SCR latch-up. This creates a low impedance path across the IC 100 causing a large amount of current to flow between Vcc and Vss, thereby disabling the IC.

Figure 2:
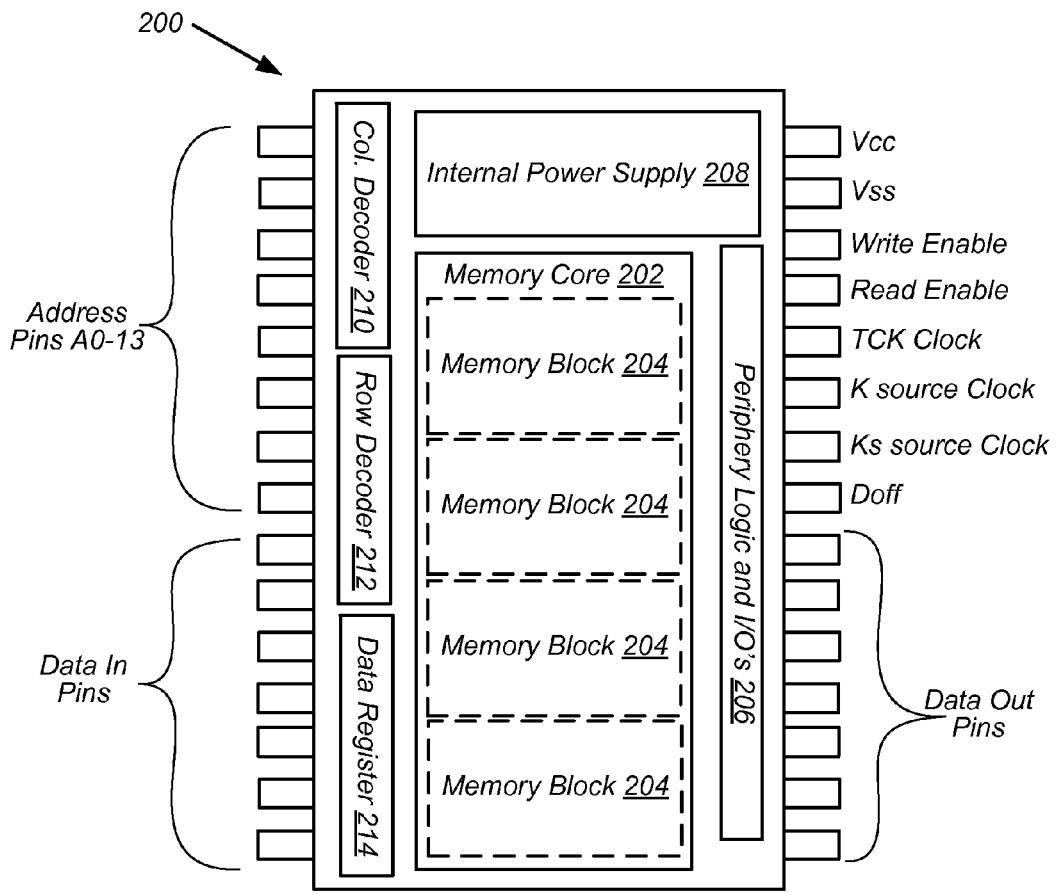
FIG. 2 is a block diagram of an IC for which an embodiment hot de-latch system and method are particularly useful.

FIG. 2 is a block diagram of an IC memory device, such as a static random access memory (SRAM), for which an embodiment or the hot de-latch system and method are particularly useful. Referring to FIG. 2, the IC 200 generally includes one or more memory cores 202 including a plurality of memory blocks 204, each including one or more memory cells (not shown), that may be used to store data and/or programs for use in an electronic computer. In addition to the memory core(s) 202 the IC 200 can include periphery logic and input/output devices (I/Os) 206 to communicate with a host computer or system, one or more internal power supplies and voltage regulators (collectively 208), a column decoder 210 and row decoder 212, and a data register 214. Generally, the IC 200 is coupled to an address bus through a number of address pins, and to data in bus our data out bus through one or more sets of data pins. Additional inputs to the IC 200 can include voltage or power supply lines, such as Vcc and Vss, control inputs and clock lines. Control inputs can include write-enable, read-enable, Chip select and Doff to enable or disable a delay locked loop (DLL) circuit in IC 200. Clock lines can include a K and Ks source clock and a JTAG clock (TCK).

Embodiments of a hot de-latch system will now be described with reference to FIG. 3A through FIG. 4.

Figure 3A:
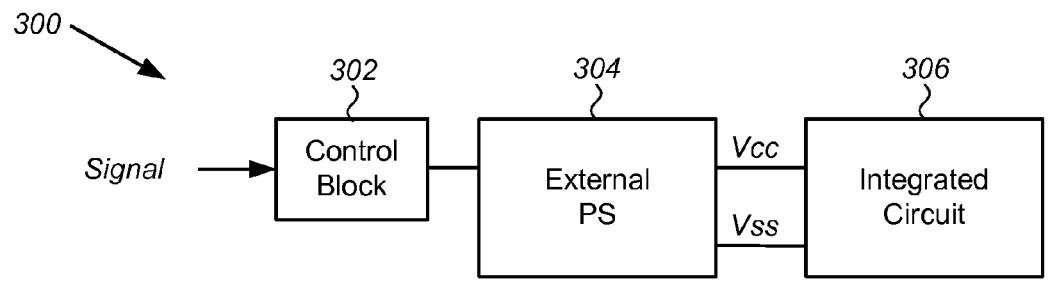
FIG. 3A is a schematic diagram of a de-latch system according to an embodiment.

Referring to FIG. 3A, in one embodiment the hot de-latch system 300 includes a control block 302 coupled to an external power supply 304 that supplies one or more external voltages, including Vcc and Vss, to an IC 306. On detection of a latch-up, the control block 302 sends a control pulse to the external power supply 304 that causes it to lower an external voltage supplied to the IC 306. The control pulse can be sent following receipt of a signal sent by an operator on detection of a latch-up event, or can be internally generated in the control block 302 in response to automatic detection of a latch-up event. For example, in an IC 306 including a memory block the latch-up event can be detected by the operator as a failure to resume normal operation following a read and/or write operation. The latch-up event can be automatically detected by detecting an increase in current (Icc) supplied to at least a portion of the IC 306, either through detecting an increase in current supplied by the external power supply 304, or by means of a feedback signal form the IC 306.

Alternatively, the control pulse can be sent not in response to detection of a latch-up event, but automatically sent at regularly scheduled intervals determined, for example, by a program in the control block to initiate a hot de-latch of the IC 306. The interval between scheduled hot de-latch can be determined from a theoretical maximum frequency of latch-up events occurring in the environment in which the IC 306 is operated, i.e., space or terrestrial, or can be empirically determined from past detected latch-up events. It will be understood, that all three methods for initiating hot de-latch, that is user initiated, automatic on detection of a latch-up and regularly scheduled, can be used concurrently with the same IC 306.

In yet another alternative, the hot de-latch can be initiated by a control pulse automatically sent during idle periods or time outs when no active operations, such as read or write cycles are being performed by the IC 306.

The external voltage lowered can include Vcc, Vss or a difference between Vcc and Vss. The lower external voltage supplied to the IC 306 lowers an internal IC voltage from a normal operating voltage to a de-latch voltage below a data retention voltage, i.e., the minimum voltage necessary to retain data in the memory core or block, and maintains the de-latch voltage for a time. Exemplary values for the normal operating voltage, de-latch voltage and data retention voltage include about 1.46V for the normal operating voltage, about 1.1V for the de-latch voltage, and about 0.85 V for the data retention voltage. Generally, the de-latch voltage is maintained for the duration of the control pulse, from about 100 microseconds (μs) to about 1 second (s). Although the control block 302 is shown as separate from the external power supply 304, in other embodiments (not shown) the control block can be included as a separate, dedicated circuit within the external power supply, or can be a voltage regulator in the external power supply.

Figure 3B:
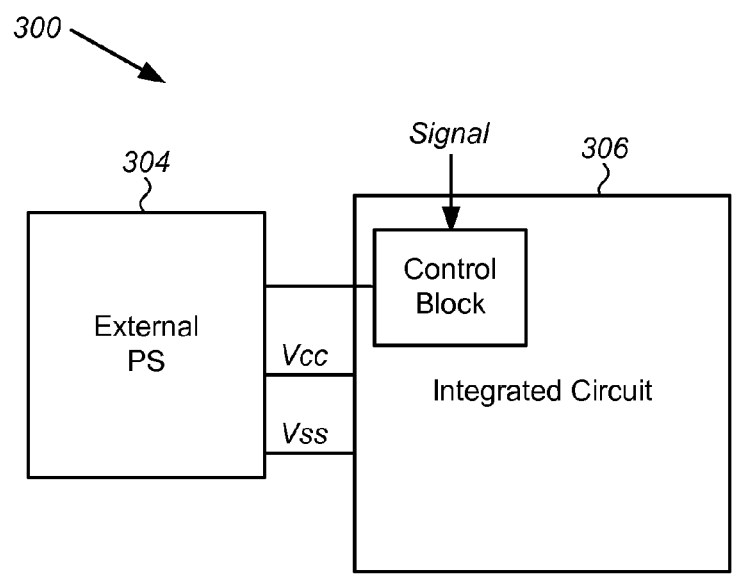
FIG. 3B is a schematic diagram a de-latch system according to another embodiment.

In another embodiment, shown in FIG. 3B, the control block 302 can be included as a separate, dedicated circuit within the IC 306. Similarly to the embodiment of FIG. 3A, The control pulse can be sent following receipt of a signal sent by an operator on detection of a latch-up event, internally generated in the control block 302 in response to automatic detection of a latch-up event or be automatically initiated at regularly scheduled intervals.

Figure 4:
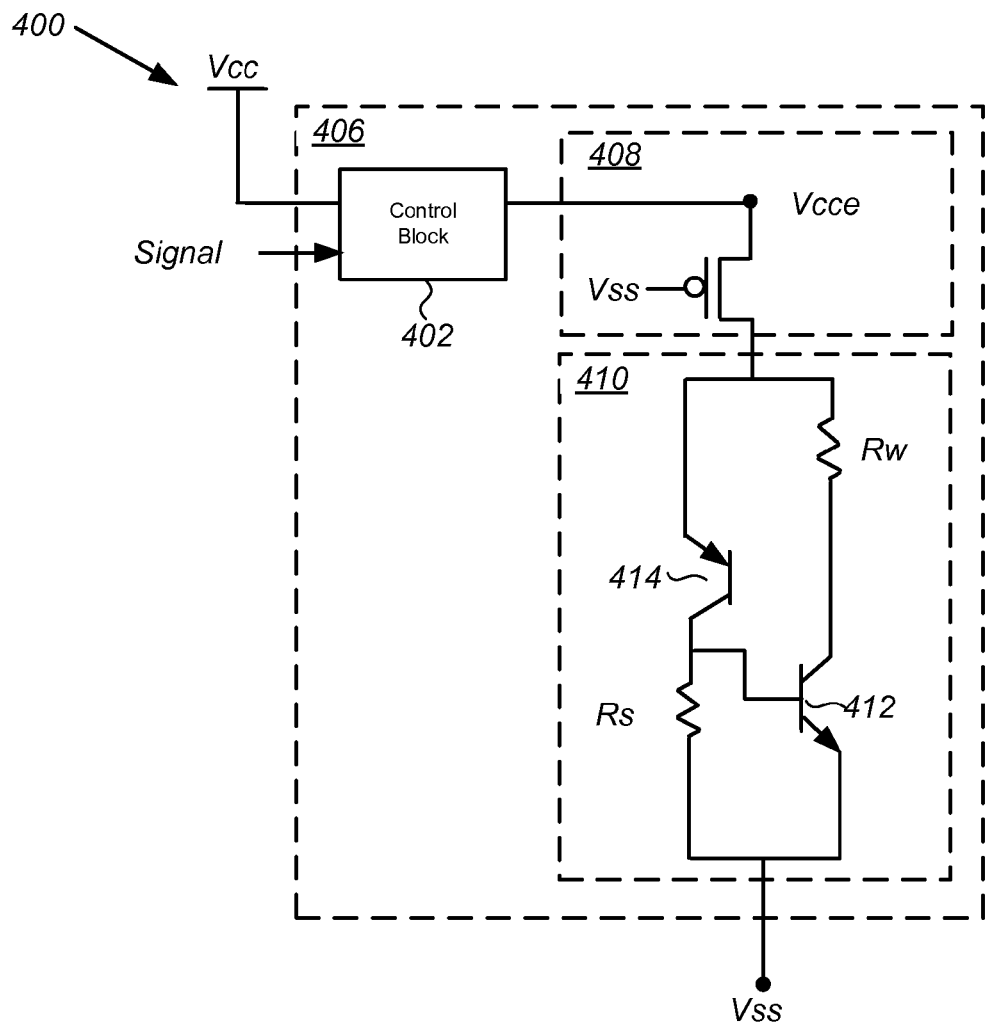
FIG. 4 is a schematic diagram a de-latch system according to yet another embodiment.

In yet another embodiment, shown in FIG. 4, the hot de-latch system 400 includes a control block 402 coupled to a local or internal power supply 408 in the IC 406 to reduce the internal IC voltage without changing operation of the external power supply 404. Similarly to the embodiment of FIGS. 3A and 3B, hot de-latch can be initiated by a signal can be sent by an operator to the control block 402, by a signal internally generated in the control block in response to detection of a latch-up event, or automatically initiated at regularly scheduled intervals or during idle periods. The control block 402 sends a control pulse to the internal power supply 408 that causes it to lower an internal IC voltage from a normal operating voltage to a de-latch voltage below a data retention voltage, and to maintain the de-latch voltage for a time to de-latch a parasitic device, such as a parasitic SCR 410, in the IC. As described above, the SCR 410 is generally a parasitic SCR, including a pair of parasitic bipolar n-p-n 412 and p-n-p 414 transistors intrinsically formed between the substrate, well and diffusion regions of PMOS and NMOS devices. The bipolar transistors 412, 414, are connected or configured as an SCR 410, which in the schematic of FIG. 4B further includes resistors Rs and Rw representing the intrinsic resistance in the substrate and well in which the PMOS and NMOS devices are fabricated.

An advantage of the embodiment shown in FIG. 4 is that the control block 402 can be coupled a number of a plurality of internal power supplies 408 (only one of which is shown) to selectively reduce the voltage supplied to only a portion of the IC 406 affected by the latch-up event. For example, in an IC 406 including a memory core with multiple memory blocks the control block 402 can reduce voltage supplied to less than all of the memory blocks.

Embodiments of methods for hot de-latch of a parasitic SCR in an IC that restores the IC to normal operation without de-powering or removing substantially all power from the IC will now be described with reference to the flow charts of FIGS. 5 and 6.

Figure 5:
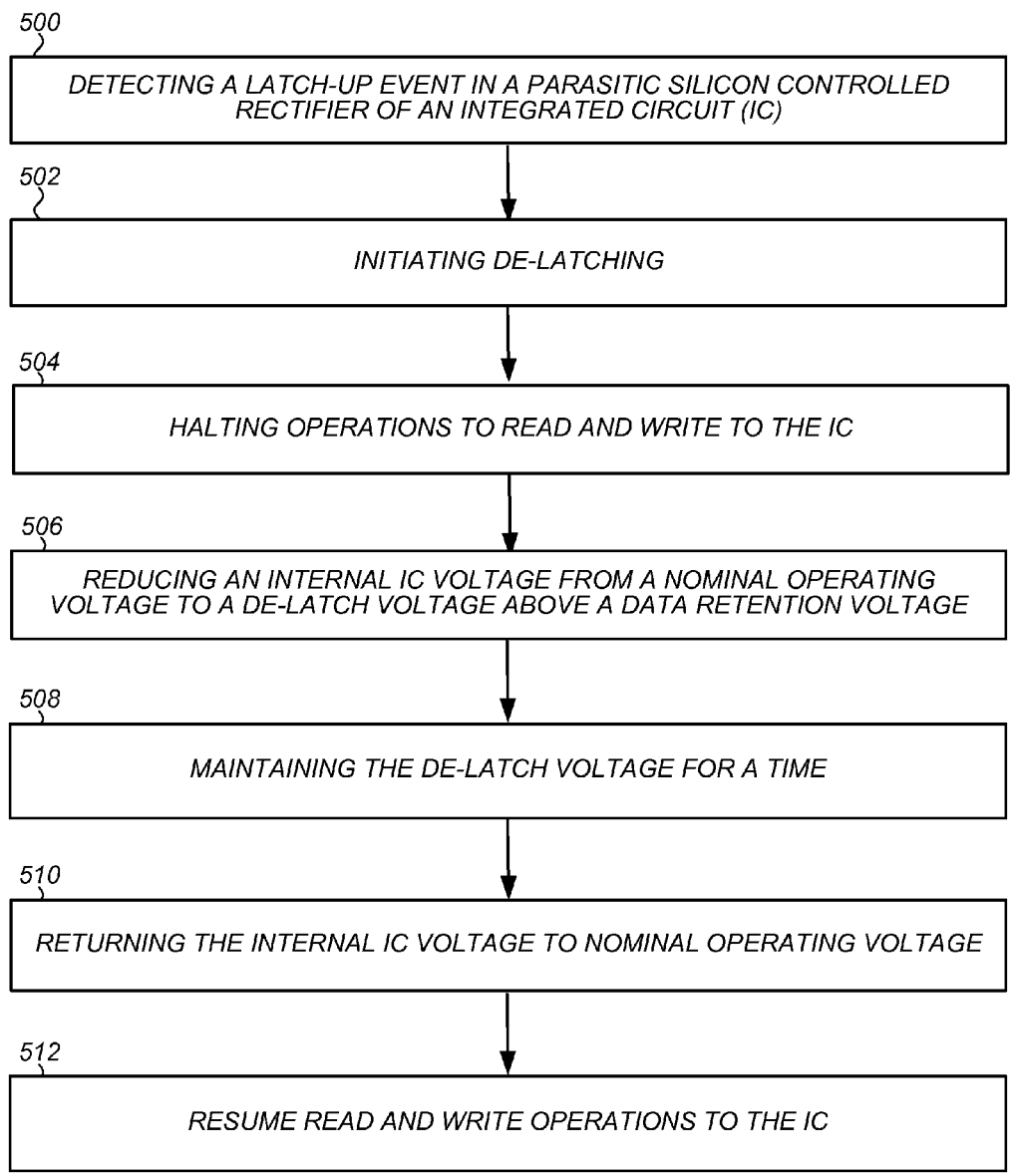
FIG. 5 is a flow chart of a method for hot de-latch according to one embodiment.

Referring to FIG. 5, in a first block or step, the method begins with detecting a latch-up event in a parasitic SCR of an IC including a memory core (block 500). In one embodiment, this accomplished automatically by sensing an increase in current drawn from power supply (Icc). The increase in current can be sensed using a current sensor or current sensing circuit in the external power supply or in the local power supply in the IC. Generally, the increase in current sensed can be as much as about 10% of the normal or normal Icc. Optionally, detecting a latch-up event can further include confirming a latch-up event has occurred by determining the IC fails to resume normal operation following a read/write operation. The hot de-latch is then initiated (block 502). In one embodiment, hot de-latch is initiated by a user applying a signal to the control block on detection of a latch-up event. In another embodiment, the signal is internally generated in the control block in response to automatic detection of a latch-up event. If the IC includes memory elements, read and/or write operations to memory core are halted (block 504). No read or write operations are permitted during the hot de-latch time to ensure de-latch of the SCR and to prevent loss of data. Read and write operations can be halted by de-asserting read and write enable pins, i.e., read and write enable pins are pulsed high, and setting address pins to 0x00 (all pulsed low). If the IC includes a delay locked loop (DLL) circuit, the DOFF signal may be held high during the hot de-latch to disable the DLL. However, it is not necessary to turn of the DLL, and not doing so will not limit or impair the hot de-latch operation.

Next, an internal IC voltage is reduced from a normal operating voltage to a de-latch voltage below a data retention voltage (block 506). Exemplary values for the normal operating voltage, de-latch voltage and data retention voltage include about 1.46V for the normal operating voltage, about 1.1V for the de-latch voltage, and about 0.85V for the data retention voltage. In one embodiment, the control pulse is applied to a control block coupled to an external power supply to lower an external voltage supplied to the IC without turning off the external power supply or de-powering the IC. In another embodiment, the control pulse is applied to an internal power supply in the IC to reduce an internal IC voltage to all or a portion of the IC without changing operation of the external power supply or de-powering the IC. The de-latch voltage is held or maintained for a period of time (block 508). The period of time for which the de-latch voltage is maintained determined by a duration of the control signal or pulse, and can be from about 100 microseconds (μs) to about 1 second (s). Thereafter, the internal IC voltage is returned to a normal operating voltage (block 510), and read and write operations resumed (block 512). Optionally, the $D_{OFF}$ signal can be toggled after the internal IC voltage is returned to a normal operating voltage to enable the DLL.

Figure 6:
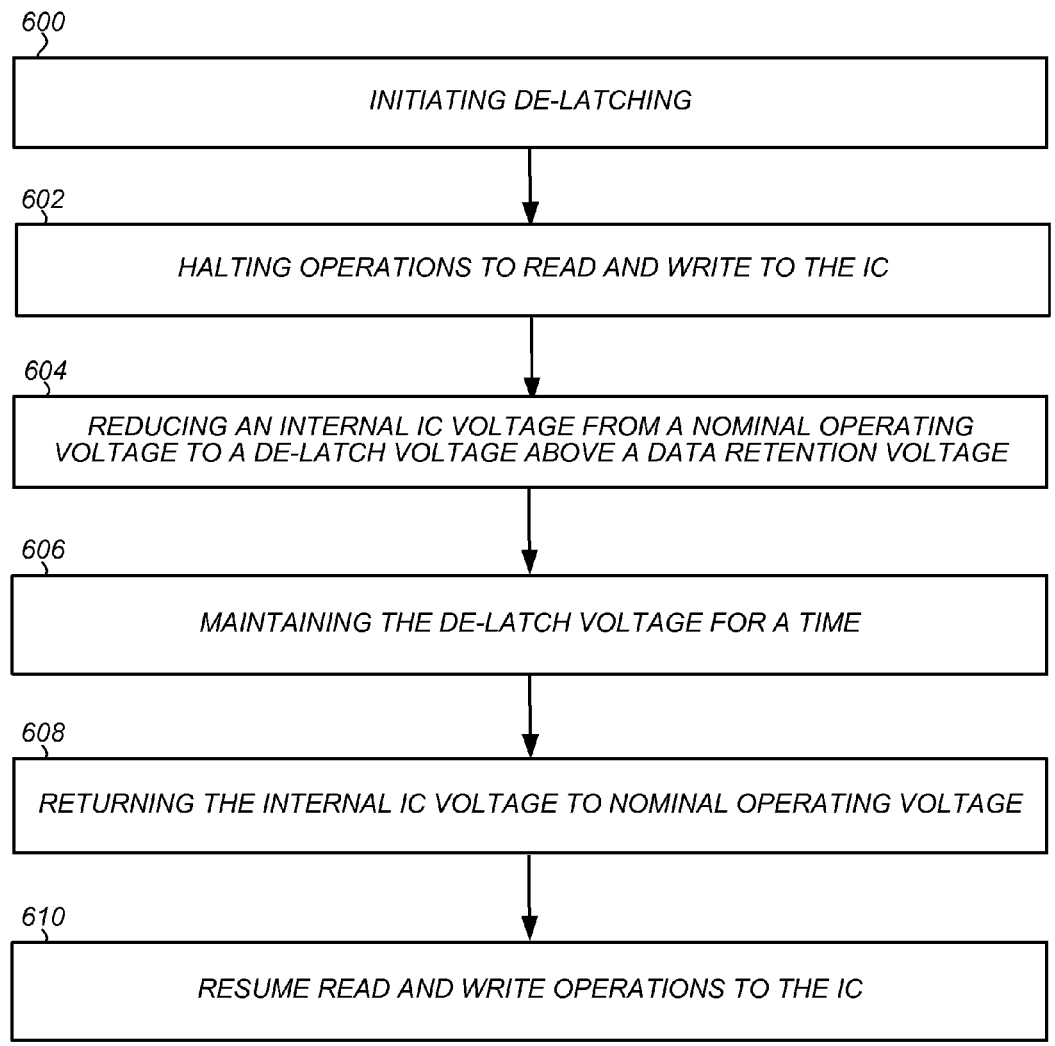
FIG. 6 is a flow chart of a method for hot de-latch according to another embodiment.

In another embodiment, shown in FIG. 6, de-latching is alternatively or additionally initiated at regularly scheduled intervals. Referring to FIG. 6, in a first block or step, the hot de-latch is initiated (block 600). If the IC includes memory elements, read and/or write operations to memory core are halted (block 602). Next, an internal IC voltage is reduced from a normal operating voltage to a de-latch voltage below a data retention voltage (block 604). The de-latch voltage is held or maintained for a period of time (block 606). Thereafter, the internal IC voltage is returned to a normal operating voltage (block 608), and read and write operations resumed (block 610).

The hot de-latch system and method were tested using a hot de-latch system similar to that shown in FIG. 4. In these tests alpha particles emitted from a Thorium-232 (232Th) foil were used in combination with elevated temperature and voltage overstress to trigger SEL in an IC including a single 128 row×128 column memory block. To confirm the SEL conditions standby current ($I_{SB}$) measurements were taken before and after the latch-up state or the non-existence of such. The method for hot de-latch of a parasitic SCR tested will now be described with reference to the timing diagram of FIG. 7, and Table I which summarizes the results of these tests.

Figure 7:
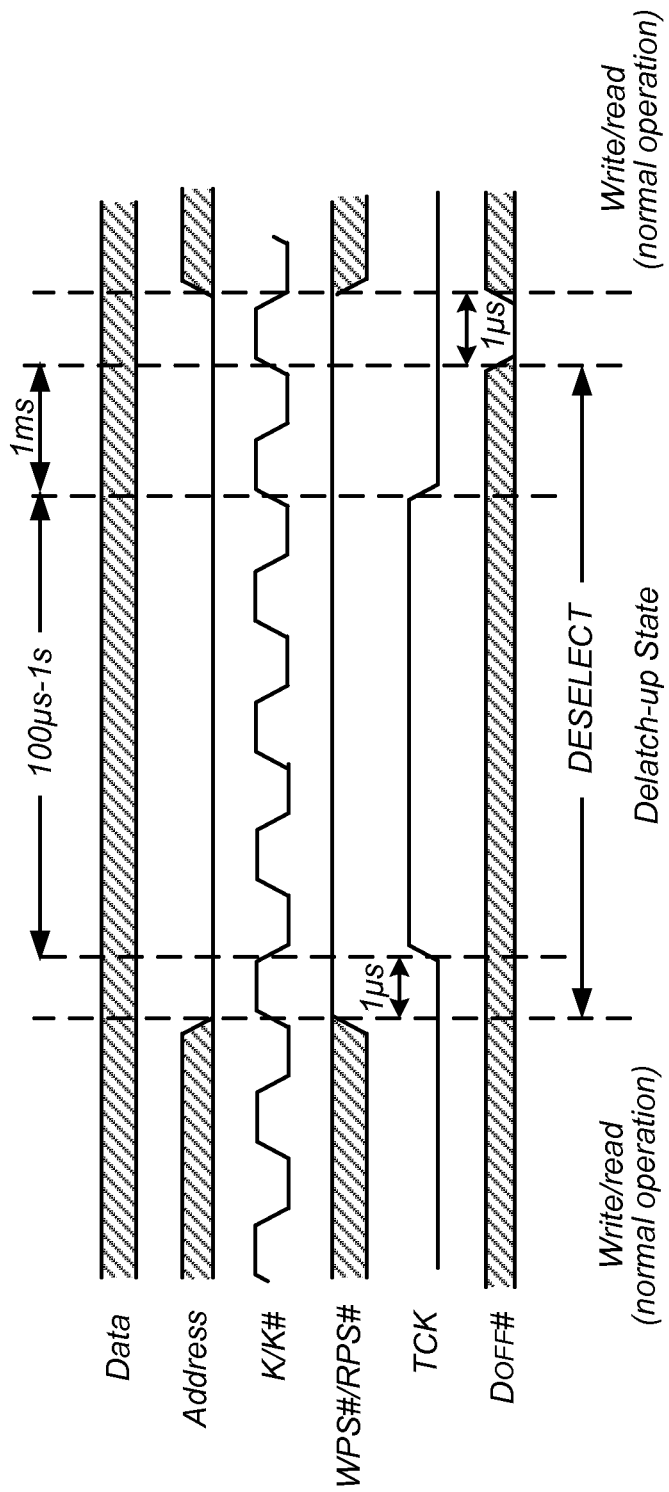
FIG. 7 is a timing diagram illustrating a de-latch pulse (TCK) applied to a clock pin of an IC device according to an embodiment.

Referring to Table I, in each test, T1 through T5, standby current ($I_{SB}$) was measured without and with the Thorium foil placed in proximity to the IC. The increase in $I_{SB}$ indicates SEL conditions (latch-up) were achieved in each test. Referring to FIG. 7, read and write operations were halted by applying a low voltage pulse to the address pins and a high voltage pulse to the write enable bar and read enable bar (WPS#/RPS#). These voltage pulses were maintained throughout the hot de-latch operation. Signals to the data pins (data) and K and Ks source clock pins (K/K#) remain unchanged. Next, TCK de-latch pulse (TCK) was applied to the JTAG clock pin on the IC for a time and $I_{SB}$ again measured to demonstrate de-latch. The TCK de-latch pulse is a high analog voltage, up to 2V over Vcc, which causes a local power supply in the IC to reduce an internal IC voltage from the normal operating voltage to the de-latch voltage. The de-latch voltage is maintained while the TCK de-latch pulse is applied.

The unchanged, high $I_{SB}$ of test 1 (T1) following application of a 1.5 V TCK de-latch pulse for 1 second indicates that the application of this voltage to the TCK clock pin is insufficient to trigger the local power supply to reduce an internal IC voltage de-latch a parasitic SCR in the IC. Tests two through five (T2-T5), however indicate the application of a 4.5 V control pulse for as little as 10 μs can de-latch the SCR as evidenced by the measured in $I_{SB}$ following de-latch and in subsequent operation

TABLE I

| Test | $I_{SB}$ Meas. w/o Alpha Foil | $I_{SB}$ Meas. w/Alpha Foil | Voltage Of Control Pulse ($V_{TCK}$) | Duration Of Control Pulse | Meas. $I_{SB}$ in De-Latch | Meas. $I_{SB}$ in Operation | Results |
|---|---|---|---|---|---|---|---|
| T1 | 172 mA | 211 mA | 1.5 V | 1 sec | 214 mA | 214 mA | Latch-up |
| T2 | 172 mA | 231 mA | 4.5 V | 1 sec | 30 mA | 176 mA | De-Latched |
| T3 | 172 mA | 219 mA | 4.5 V | 100 ms | 29 mA | 175 mA | De-Latched |
| T4 | 172 mA | 244 mA | 4.5 V | 1 ms | 29 mA | 175 mA | De-Latched |
| T5 | 172 mA | 218 mA | 4.5 V | 10 μs | 27 mA | 175 mA | De-Latched |

Figure 8:
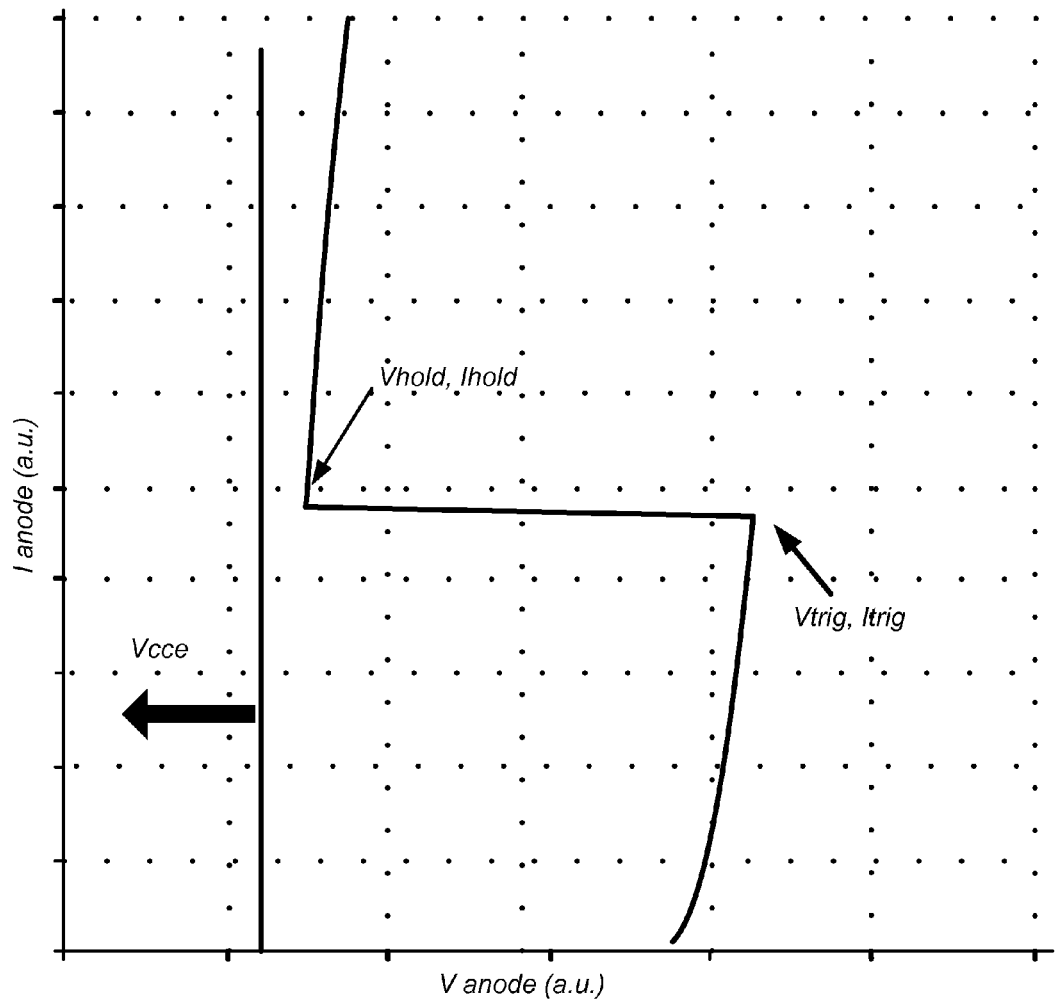
FIG. 8 is a plot of anode current and voltage during a SEL according to an embodiment.

FIG. 8 is a plot illustrating characteristics of the IC before during a SEL. In particular, FIG. 8 depicts the current vs. voltage (IV) characteristic of the SCR 114, 320. Referring to FIG. 8, when a trigger voltage ($V_{trig}$) is exceeded by the injection of energetic charged particles, the SCR 114, 310, enters a negative resistance region termed as Latch-up. The resulting voltage is the holding voltage ($V_{hold}$). To unlatch the SCR 114, 310, the applied voltage $V_{CCE}$ must be reduced to a value less than the holding voltage. Under these conditions the SCR 114, 310, will unlatch.

Thus, embodiments of an IC including a hot de-latch circuit and methods for operating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the hot de-latch system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the hot de-latch system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method of de-latching a parasitic device in an integrated circuit (IC) comprising reducing a voltage supplied to at least a portion of the IC from a normal operation voltage to a de-latch voltage for a time to de-latch the parasitic device without de-powering the IC.

2. The method of claim 1, wherein the IC comprises a memory cell and wherein the de-latch voltage is lower than a sustaining voltage for the parasitic device but above a data retention voltage for the memory cell.

3. The method of claim 2, wherein the voltage supplied to the IC is supplied by an external power supply and wherein reducing the voltage supplied to at least a portion of the IC comprises reducing the voltage supplied by the external power supply to the IC.

4. The method of claim 2, wherein reducing the voltage supplied to at least a portion of the IC comprises sending a control pulse to an internal power supply in the IC to reduce the voltage supplied to at least a portion of the IC from the normal operating voltage to the de-latch voltage.

5. The method of claim 4, wherein the IC comprises a plurality of memory blocks, each including one or more memory cells, and wherein reducing the voltage supplied to at least a portion of the IC comprises reducing the voltage supplied to less than all of the memory blocks.

6. The method of claim 4, wherein reducing the voltage supplied to at least a portion of the IC comprises reducing the voltage to at least a portion of the IC for a duration of the control pulse.

7. The method of claim 6, wherein the duration of the control pulse is from about 100 microseconds to about 1 second.

8. The method of claim 4, wherein the control pulse is applied to a clock input of the IC.

9. The method of claim 2, wherein the de-latch voltage is 1.1 volts (V) and the data retention voltage is 0.85 V.

10. The method of claim 1, further comprising detecting latch-up of the parasitic device.

11. The method of claim 10, wherein detecting latch-up of the parasitic device comprises detecting failure to resume normal operation following a read/write operation.

12. The method of claim 10, wherein detecting latch-up of the parasitic device comprises detecting an increase in current (Icc) supplied to at least a portion of the IC.

13. The method of claim 10, further comprising automatically initiating de-latching following detecting latch-up of the parasitic device by reducing the voltage supplied to at least a portion of the IC.

14. The method of claim 10, further comprising a user initiating de-latching following detecting latch-up of the parasitic device by reducing the voltage supplied to at least a portion of the IC.

15. The method of claim 1, further wherein de-latching is initiated at regularly scheduled intervals.

16. A method of de-latching a parasitic silicon controlled rectifier (SCR) in an integrated circuit (IC) including a memory core, comprising:
   detecting a latch-up event in the parasitic SCR in the IC;
   halting read and write operations to the memory core;
   reducing a voltage supplied to at least a portion of the IC from a normal operation voltage to a de-latch voltage lower than a sustaining voltage for the parasitic SCR but above a data retention voltage for the memory core; and
   maintaining the de-latch voltage for a time to selectively de-latch the parasitic SCR.

17. The method of claim 16, wherein the memory core comprises a plurality of memory blocks, and wherein reducing the voltage supplied to at least a portion of the IC, comprises reducing the voltage supplied to less than all of the memory blocks.

18. The method of claim 16, wherein reducing the voltage supplied to at least a portion of the IC comprises sending a control pulse to an internal power supply in the IC, and wherein maintaining the de-latch voltage for a time to selectively de-latch the parasitic SCR comprises maintaining the de-latch voltage for a duration of the control pulse.

19. A system, comprising:
   an integrated circuit (IC) including a memory core and parasitic bipolar p-n-p and n-p-n transistors configured as a parasitic silicon controlled rectifier (SCR);
   an external power supply powering the IC; and
   a control block to reduce an internal IC voltage supplied to at least a portion of the IC for a time from a normal operation voltage to a de-latch voltage lower than a sustaining voltage for the parasitic SCR but above a data retention voltage for the memory core to selectively de-latch the parasitic SCR without de-powering the IC.

20. The system of claim 19, wherein the control block is coupled to the external power supply to lower an external voltage supplied to the IC without turning off the external power supply.

21. The system of claim 19, wherein the control block is coupled to an internal power supply in the IC to reduce the voltage supplied to at least a portion of the IC from the normal operating voltage to the de-latch voltage.

22. The system of claim 19, wherein the control block is configured to reduce the internal IC voltage supplied to at least a portion of the IC in response to a user initiated control pulse.

23. The system of claim 19, wherein the control block is configured to automatically reduce the internal IC voltage supplied to at least a portion of the IC at regularly scheduled intervals.

24. The system of claim 19, wherein the control block is configured to automatically reduce the internal IC voltage supplied to at least a portion of the IC on detecting latch-up of the parasitic SCR.

* * * * *